US010600705B2

(12) United States Patent
Gottwald et al.

(10) Patent No.: US 10,600,705 B2
(45) Date of Patent: Mar. 24, 2020

(54) ELECTRONIC SWITCHING ELEMENT AND MODULARLY CONSTRUCTED POWER CONVERTER

(71) Applicant: Schweizer Electronic AG, Schramberg (DE)

(72) Inventors: Thomas Gottwald, Dunningen (DE); Christian Rössle, St. Georgen (DE); Rainer Jäackle, Dunningen (DE)

(73) Assignee: SCHWEIZER ELECTRONIC AG, Schramberg (DE)

( * ) Notice: Subject to any disclaimer, the term of this patent is extended or adjusted under 35 U.S.C. 154(b) by 0 days.

(21) Appl. No.: 15/747,674

(22) PCT Filed: Aug. 10, 2016

(86) PCT No.: PCT/EP2016/069037
§ 371 (c)(1),
(2) Date: Jan. 25, 2018

(87) PCT Pub. No.: WO2017/029167
PCT Pub. Date: Feb. 23, 2017

(65) Prior Publication Data
US 2018/0226315 A1   Aug. 9, 2018

(30) Foreign Application Priority Data

Aug. 14, 2015   (DE) .................. 10 2015 113 503

(51) Int. Cl.
*H01L 23/31* (2006.01)
*H01L 23/538* (2006.01)
(Continued)

(52) U.S. Cl.
CPC ...... *H01L 23/3121* (2013.01); *H01L 23/5389* (2013.01); *H01L 24/00* (2013.01); *H01L 24/19* (2013.01); *H01L 24/20* (2013.01); *H02M 7/003* (2013.01); *H01L 2224/04105* (2013.01); *H01L 2224/06181* (2013.01); *H01L 2224/2518* (2013.01); *H01L 2924/1301* (2013.01);
(Continued)

(58) Field of Classification Search
CPC ..... H01L 23/3121; H01L 24/00; H01L 24/19; H01L 24/20; H01L 23/5389; H02M 7/003
See application file for complete search history.

(56) References Cited

U.S. PATENT DOCUMENTS 6,798,677 B2   9/2004   Jacob et al.
7,656,015 B2 *  2/2010   Wong .................. H01L 23/3677
257/685

(Continued)

FOREIGN PATENT DOCUMENTS

DE   10 2011 001 077   9/2011
DE   10 2013 219 192   3/2015
EP   2 190 015   5/2010

*Primary Examiner* — Earl N Taylor
(74) *Attorney, Agent, or Firm* — Shlesinger, Arkwright & Garvey LLP

(57) ABSTRACT

An electronic switching element includes at least one semiconductor switch inserted into a layer sequence of a conductor structure element; and at least two busbars which are configured to contact-connect the at least one semiconductor switch, wherein the at least two busbars run substantially above one another in the layer sequence of the conductor structure element.

28 Claims, 9 Drawing Sheets

(51) Int. Cl.
*H02M 7/00* (2006.01)
*H01L 23/00* (2006.01)
*H05K 1/18* (2006.01)

(52) U.S. Cl.
CPC ............... *H01L 2924/13055* (2013.01); *H01L 2924/13091* (2013.01); *H05K 1/185* (2013.01); *H05K 2201/10166* (2013.01)

(56) References Cited

U.S. PATENT DOCUMENTS

| | | | |
|---|---|---|---|
| 8,441,114 B2 | 5/2013 | Bimer et al. | |
| 1,002,709 A1 | 7/2018 | Baeumel et al. | |
| 2005/0135065 A1* | 6/2005 | Nakatsu | H01L 23/4006 361/703 |
| 2006/0115931 A1* | 6/2006 | Hsu | H01L 23/5389 438/121 |
| 2006/0145328 A1* | 7/2006 | Hsu | H01L 23/5389 257/690 |
| 2009/0205202 A1* | 8/2009 | Tanaka | H01L 24/82 29/834 |
| 2010/0170085 A1* | 7/2010 | Schaaf | H01L 23/3121 29/832 |
| 2010/0327678 A1* | 12/2010 | Yamasaki | H02K 3/522 310/64 |
| 2010/0328913 A1* | 12/2010 | Kugler | H01L 24/18 361/761 |
| 2011/0148337 A1* | 6/2011 | Yamada | H01L 25/072 318/400.26 |
| 2011/0290540 A1* | 12/2011 | Jung | H01L 23/13 174/255 |
| 2016/0020194 A1* | 1/2016 | Gottwald | H05K 1/185 257/774 |

\* cited by examiner

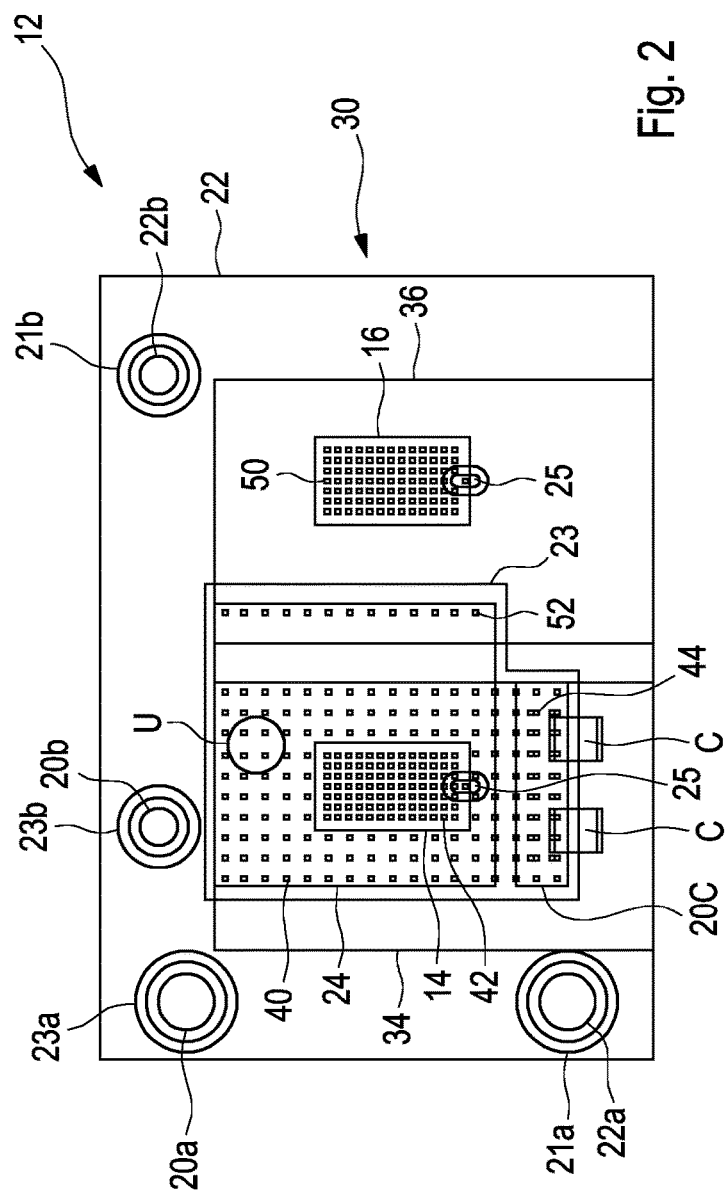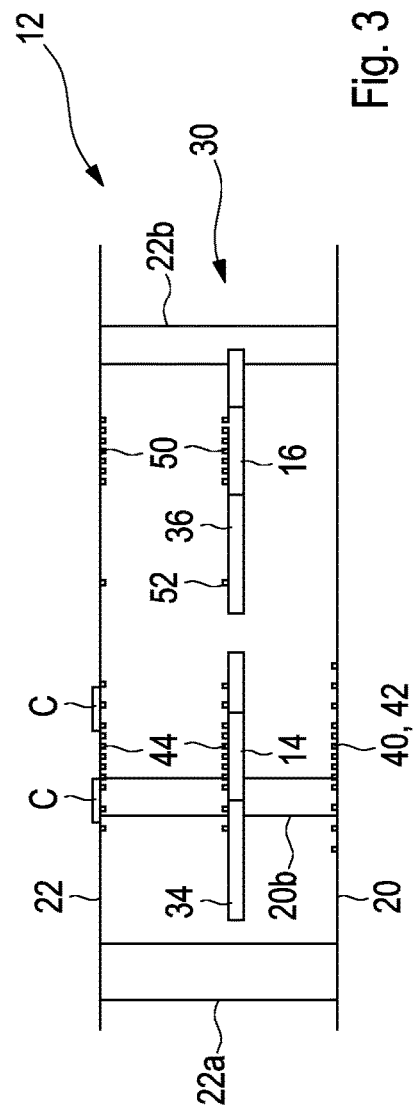

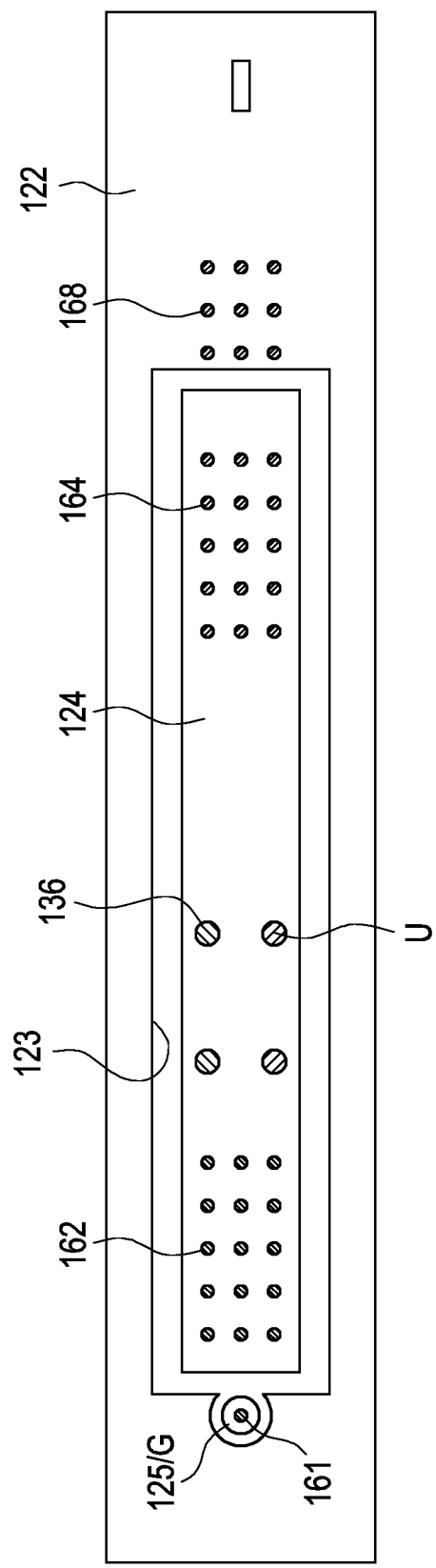
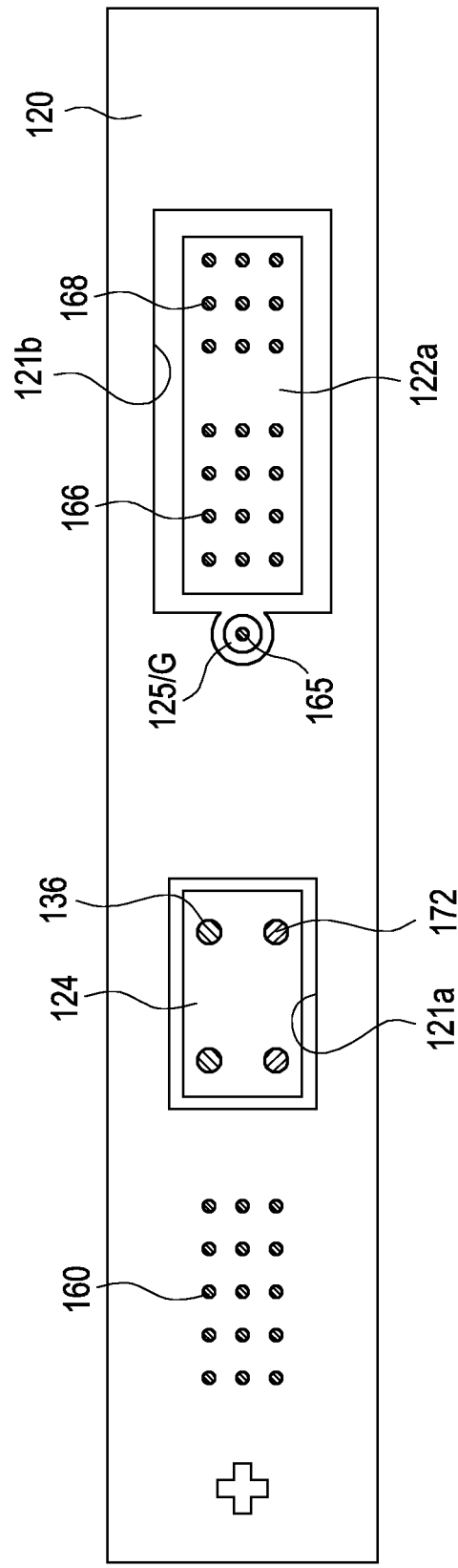

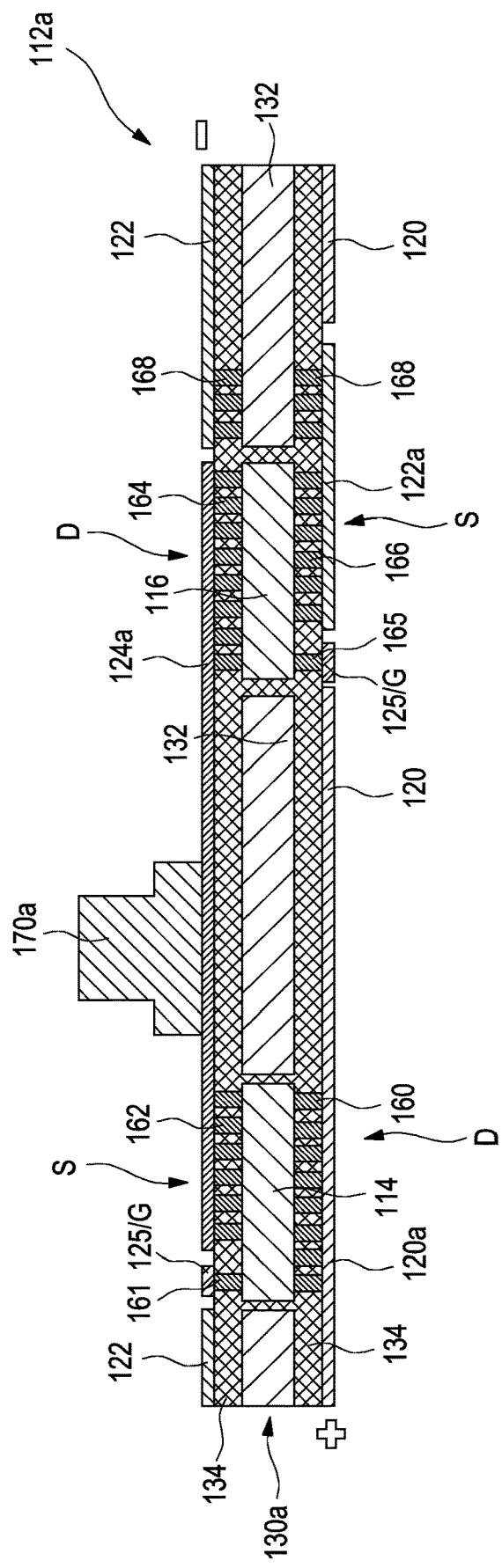

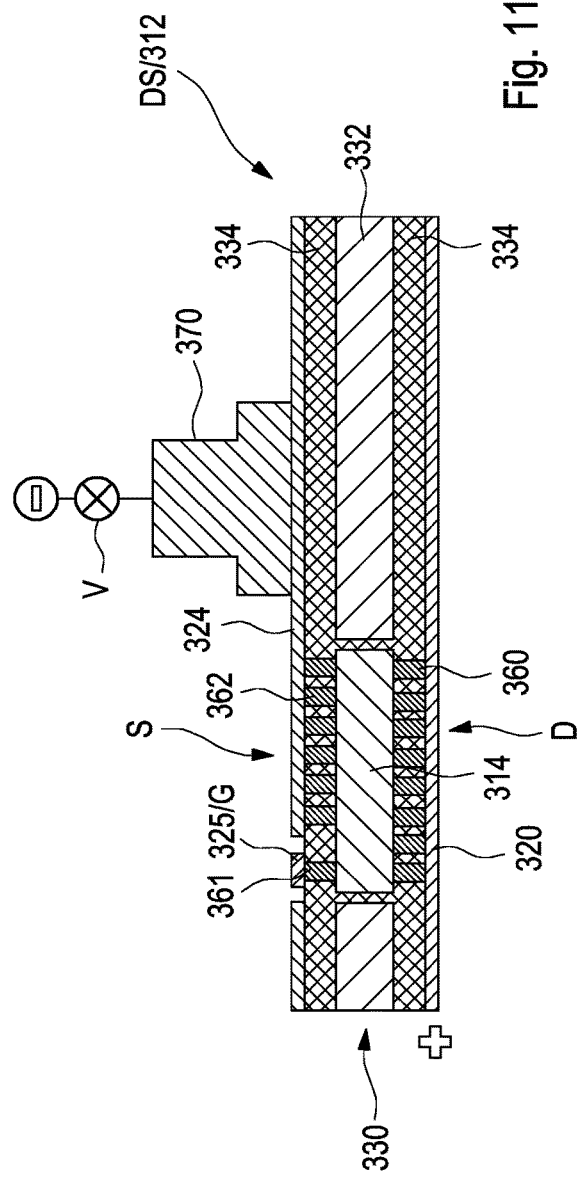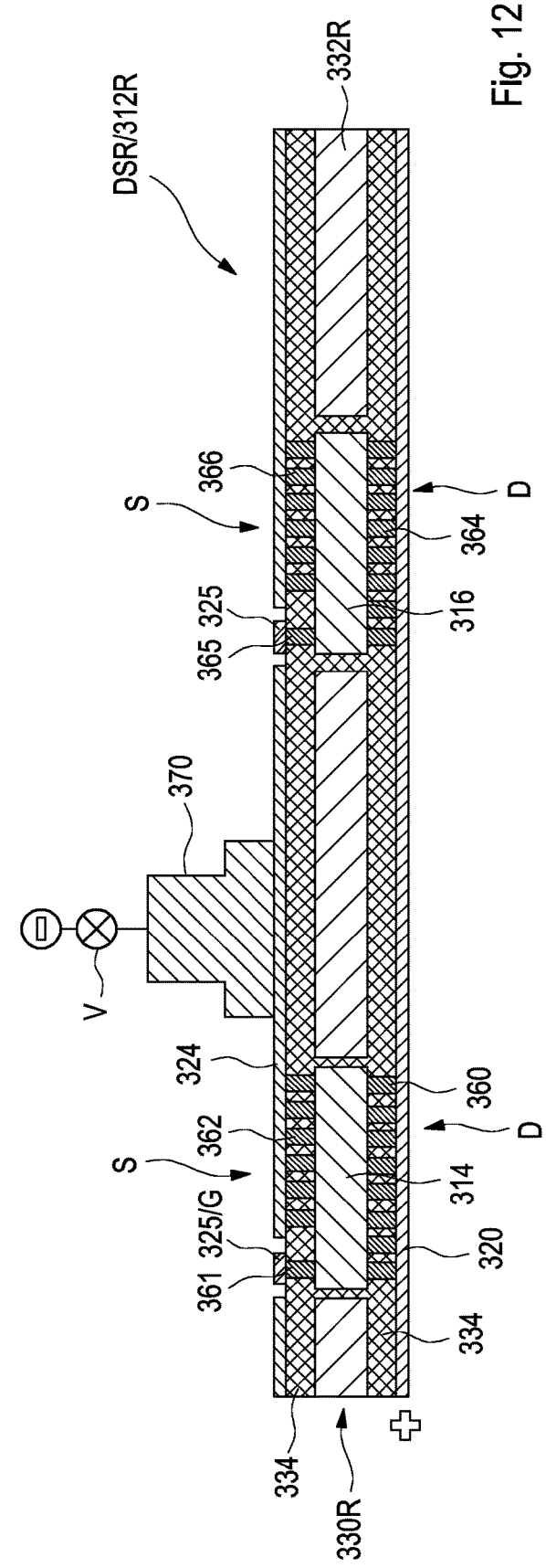

ELECTRONIC SWITCHING ELEMENT AND MODULARLY CONSTRUCTED POWER CONVERTER

This is a national stage of International PCT Application No. PCT/EP2016/069037, filed Aug.10,2016, which claims the priority benefit of Germany 10 2015 113503.5, filed Aug.14,2015, both of which are hereby incorporated by reference.

TECHNICAL FIELD

The present invention relates to an electronic switching element, namely to the field of switches and, in particular, of high-speed switches having an active semiconductor switching element. The invention relates furthermore to a power module for a converter and to a modularly constructed converter.

DESCRIPTION OF THE PRIOR ART

Converters for operating an electric machine of a hybrid or electric vehicle for converting the direct current provided to phase currents for operating the electric machine are known. It is furthermore known to construct converters from power modules having at least two semiconductor power switches (cf. DE 100 37 379 B4 and DE 10 2007 046 969 B3, for example). A layered structure of a power module for a converter is known from DE 10 2013 207 507 B3.

SUMMARY OF THE INVENTION

In contrast, an electronic switching element having the features as disclosed herein claim 1 and a converter having the features as disclosed herein claim 24 are proposed in accordance with the invention.

The invention provides an electronic switching element configured as a conductor structure element, said electronic switching element having at least one semiconductor switch, wherein the lines connected to the at least one semiconductor switch are configured as busbars, which run substantially above one another. A busbar is to be understood in this context as a conductor track of planar design, for example a thick copper track. The at least two busbars for contact-connecting the at least one semiconductor switch can in this case occupy substantially the entire width or at least the majority of the width of the conductor structure element.

The invention makes it possible to produce switches for printed circuit board applications with a reduced physical size, in particular a reduced physical height. On account of the configuration according to the invention, switches having at least one semiconductor switch can be provided in a very planar construction, which switches are very well suited to embedding in a printed circuit board layer. This is advantageous, in particular, in applications in which a multiplicity of switches are to be placed in a small space and where appropriate a corresponding additional number of redundant switches are also to be provided, as is the case, for example, in aircraft applications. Compared to conventional transistors as separate components that have to be populated, embedding in a printed circuit board reduces the safety risk in the event of overloading of the transistors.

The invention also makes it possible to produce high-speed electronic switching elements while minimizing undesired interference inductances. The configuration according to the invention of a layer construction having (planar) busbars, which run substantially above one another and overlap to a great extent with one another and with the semiconductor switches of the arrangement likewise integrated in the layer construction, produces a design of an electronic switching element with a low inductance compared to conventional arrangements. The space-saving construction also associated therewith benefits integration of the switching elements in printed circuit boards for forming sound funnels for electric motors that are used, in particular, in the field of motor vehicles. The planar construction makes it possible to further integrate the sound funnel printed circuit boards in electric motor housings in a compact construction.

Further advantages and configurations of the invention emerge from the description and the appended drawing.

It goes without saying that the features mentioned above and those still to be explained below can be used not only in the respectively specified combination, but also in other combinations or alone, without departing from the scope of the present invention.

The invention is schematically illustrated in the drawing on the basis of an exemplary embodiment and is described in detail below with reference to the drawing.

BRIEF DESCRIPTION OF THE DRAWING

FIG. 2 shows a plan view of a highly schematic, semi-transparent illustration of an electronic switching element according to the invention.

FIG. 3 shows the electronic switching element of FIG. 2 in a lateral exploded view.

FIG. 6 shows a plan view of a top side of the electronic switching element of FIG. 5.

FIG. 7 shows a plan view of an underside of the electronic switching element of FIG. 5.

FIG. 8 shows a schematic sectional illustration of an alternative configuration of the electronic switching element according to the invention of FIG. 5.

FIG. 11 shows, as a further embodiment of the invention, a lateral schematic sectional illustration of an electronic switching element having a semiconductor switch as the switch.

FIG. 12 shows the switch of FIG. 11 having an additional semiconductor switch connected in parallel in a redundant arrangement.

DETAILED DESCRIPTION

Figure 1:
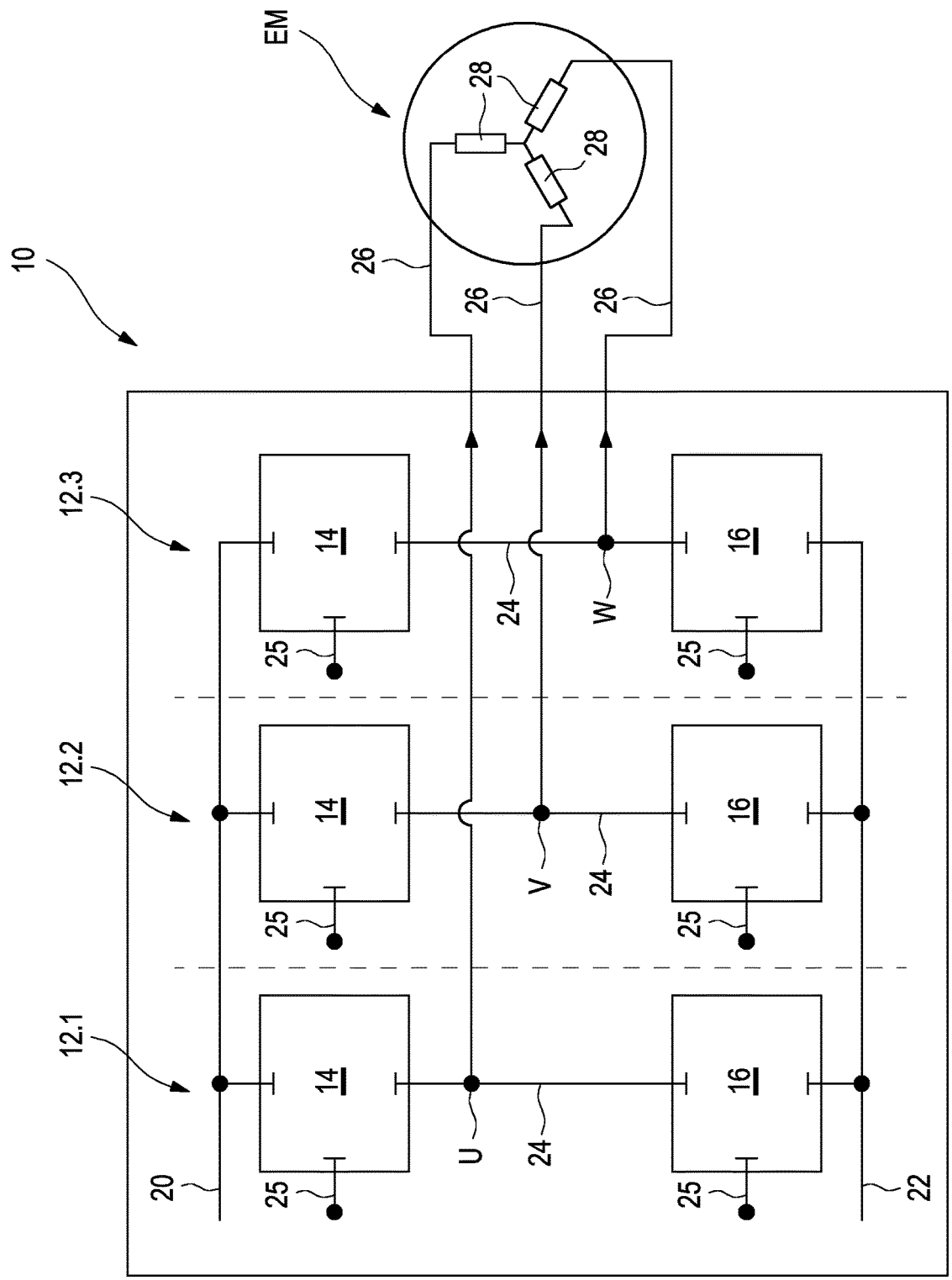
FIG. 1 shows a schematic circuit diagram of a modular converter connected to an electric motor.

FIG. 1 shows a highly schematic basic outline of a circuit diagram of a modular converter 10 constructed in accordance with the invention and connected to an electric motor EM.

The electric motor EM serves, for example, for propulsion of a motor vehicle and the converter 10 serves for providing electrical energy in the form of phase currents for the electric motor EM, which, in the exemplary embodiment illustrated, has three windings 28. The three windings 28 of the electric motor EM are each electrically connected to the converter 10 by means of a phase current line 26.

In the exemplary embodiment illustrated, the modularly constructed converter 10 is configured as a B6 bridge circuit and comprises three largely identically configured half-bridges 12 (12.1, 12.2, 12.3) between a first power supply line or busbar 20 and a second power supply line or busbar 22, said half-bridges being arranged in a parallel circuit with one another. In the illustration of FIG. 1, the half-bridges are isolated from one another by the vertical dashed lines. Each of the illustrated half-bridges is an electronic switching element constructed in accordance with the invention, as is described in more detail below.

Each of the three half-bridges 12 respectively comprises a first semiconductor switch 14 (here: high-side) and a second semiconductor switch 16 (here: low-side), which are illustrated as rectangles in the basic outline of FIG. 1. The two semiconductor switches 14 and 16 of each module 12 are connected to one another using a third busbar 24, to which in each case a tap (center terminal) U, V and W, respectively, for the phase current lines 26 transmitting the phase current to the electric motor is connected.

In the exemplary embodiment illustrated, the first semiconductor switches 14 are arranged at a positive-voltage-side current path and thus between the the first (positive) busbar 20 and one of the phase current lines 26 and the second semiconductor switches 16 are arranged at a negative-voltage-side current path and thus between one of the phase current lines 26 and the second (negative) busbar 22.

Each of the semiconductor switches 14, 16 has a power connection 25 for applying a control signal for a gate terminal of the semiconductor switch 14, 16.

The converter 10 can have further circuit components, such as one or more link capacitors, for example, which are not shown in the illustration of FIG. 1 for reasons of better clarity.

Figure 4:
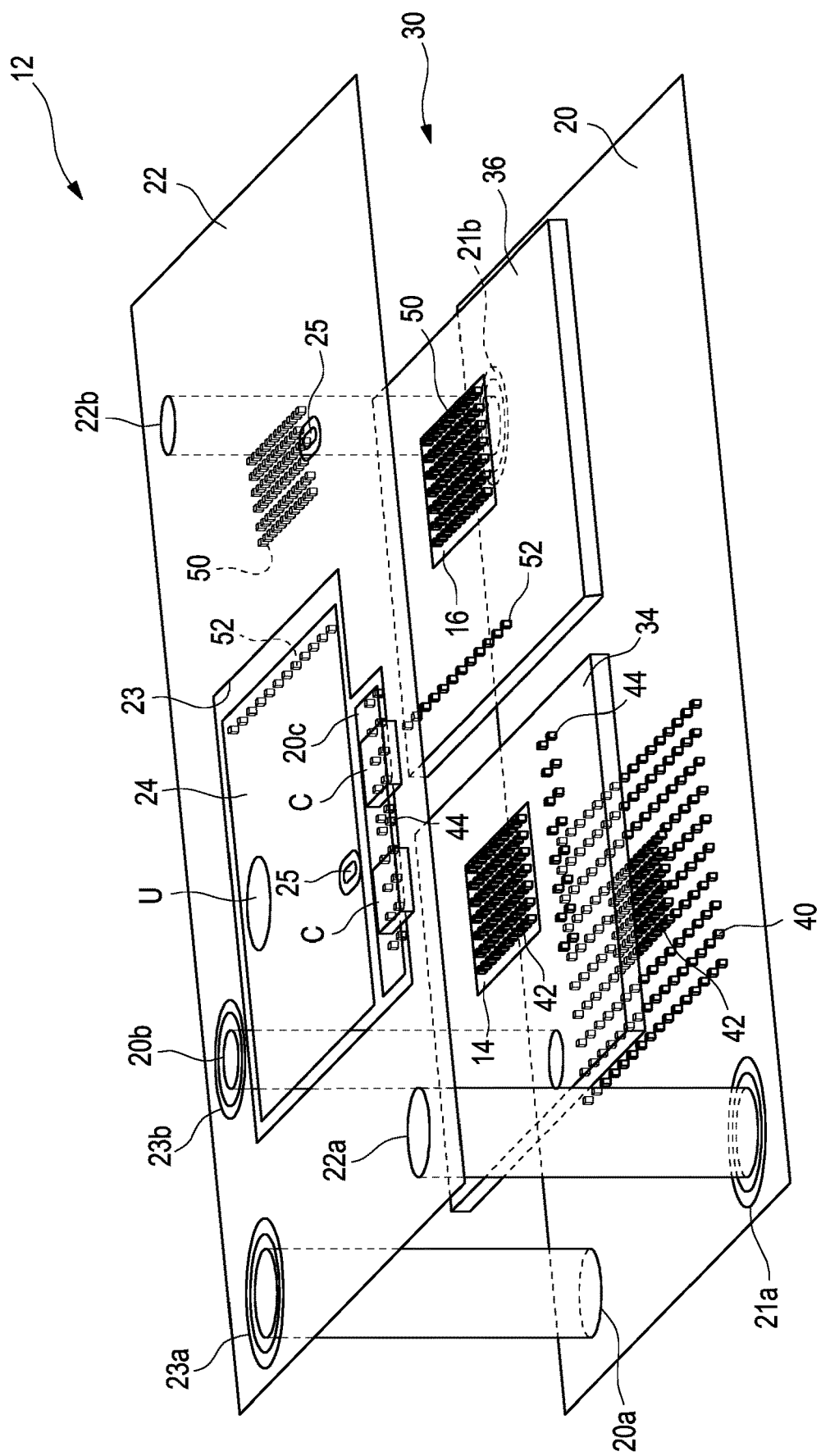
FIG. 4 shows a perspective view of the exploded illustration of FIG. 3.

FIG. 2 shows a semi-transparent plan view of an exemplary embodiment of a switch module or an electronic switching element or bridge switch 12 in accordance with the invention such that even bottom layers of the layer structure can be identified. FIG. 3 shows a lateral exploded view of the exemplary embodiment of FIG. 2 such that, for reasons of better visibility, the layers positioned closer to one another are set wider apart from one another and intermediate layers (such as isolating intermediate layers, for example) are not shown. FIG. 4 finally shows a perspective view of the exploded illustration of FIG. 3.

The electronic switching element 12 configured as a half-bridge has a first and a second semiconductor switch 14, 16, which are inserted in a layer sequence of a conductor structure element 30. In the exemplary embodiment illustrated, the semiconductor switches 14, 16 are located substantially on the same plane or level of the layer construction. The first and the second semiconductor switch 14, 16 can be mounted—as illustrated—on so-called leadframes (lead carriers) 34, 36. The mounting on the leadframes serves for mechanical fixing and/or electrical contact-connection. In the exemplary embodiment illustrated, electrical contact-connection is realized using the drain terminal of each semiconductor switch. The semiconductor switches are inserted in the layer construction on the leadframes. This process is known per se to those skilled in the art. However, the semiconductor switches 14, 16 can also be inserted directly, as is the case in the exemplary embodiment of FIGS. 5 to 7.

A first busbar 20 for connecting the first semiconductor switch 14 to a DC voltage is formed, for example, as a thick copper track in a bottom plane of the conductor structure element 30. In an analogous manner, a second busbar 22 for connecting the second semiconductor switch 16 to a DC voltage is formed, for example, as a thick copper track in a top plane of the conductor structure element 30. In the exemplary embodiment illustrated, the bottom busbar 20 represents the positive-pole connection whereas the top busbar 22 represents the negative-pole connection.

In the exemplary embodiment illustrated, a third busbar for connecting the first and the second semiconductor switch 14, 16 is formed in a top plane of the conductor structure element 30, appropriately in the same plane as the second busbar 22 and likewise as a thick copper track (isolated from 22, however). A terminal point (central terminal) U for tapping off the phase current for the electric motor EM is located at or on the third busbar—as already described above with reference to FIG. 1.

A link capacitor C (so-called DC link) is connected between the second busbar 22 and the first busbar 20 (there are two link capacitors in the exemplary embodiment illustrated). The link capacitor can be, for example, a ceramic capacitor (such as a CCC capacitor). In order to make a space-saving arrangement of the link capacitors possible, the first busbar is, in the embodiment illustrated, drawn into the plane of the second busbar 22 into a recess 23 provided therefor by means of plated-through hole connections. The link capacitors C can therefore be placed directly onto the busbars 20, 22 that lie adjacent to one another but are electrically isolated.

The link capacitors C illustrated are comparatively low-capacitance elements having a low inherent inductance. If more high-capacitance capacitors are also intended to be connected (such as an electrolytic capacitor, for example, not illustrated), this may be done at terminals (20a, 22a and 20b, 22b, respectively, which are provided for this purpose. Said terminals 20a, 22a and 20b, 22b, respectively, extend from the first (positive pole) and the second (negative pole) busbar 20, 22, respectively, through the layer construction to the respectively other busbar and, for the purpose of electrical isolation, lead there in each case into a recess 21a, 21b or 23a, 23b provided therefor in the corresponding busbar.

The illustrated and described terminals 20a, 22a and 20b, 22b, respectively, are used, in particular, when using wired capacitor elements. Alternatively, high-capacitance capacitors can also be mounted using SMD technology (analogously to the already illustrated and described low-capacitance ceramic capacitors C). Terminals 20a, 22a and 20b, 22b, respectively, that are not used for a link capacitor terminal can be used for contact-connecting positive/negative. It is also possible to use an identical terminal pair both for contact-connecting positive/negative and for connecting a link capacitor.

The bottom busbar 20 is electrically connected to the leadframe 34 or the semiconductor switch 14 situated in a plane of the layer sequence of the conductor structure element 30, said plane being situated above said bottom busbar, by means of a plurality of contacts or microvias 40 and 42 (drain contact). A further plurality of microvias 44, which establishes a connection to the partial busbar of the first busbar 20, said partial busbar being arranged in the plane of the second busbar 22 and situated above said microvias, is located on said leadframe 34. As already described, said partial busbar is arranged in a recess 23 in the second busbar 22. The recess 23 is furthermore configured in such a way that it also receives the third busbar 24. Although the second busbar 22, the partial busbar of the first busbar 20 and the third busbar 24 are in the same plane, they are electrically isolated from one another.

It should be noted at this juncture that the term "microvia" should be understood in this application as a synonym for each type of vertical contact-connection in a conductor layer construction. The direction indication "vertical" relates in this case to the direction perpendicular to a longitudinal extent of the layer construction, as is also clear from the illustrations.

The second busbar 22 is connected using a plurality of microvias 50 to the second semiconductor switch 16 situated below said microvias in a similar manner (source contact). The second leadframe 36, on which the second semiconductor switch 16 is mounted and to which it is electrically conductively connected, is again electrically connected using a plurality of microvias to the third busbar 24 situated above said microvias, whereby the connection to the drain contact is established.

Above the first semiconductor switch 14 and the second semiconductor switch 16, recesses are located in the third busbar 24 and the second busbar 22, respectively, to receive the power connections 25 for applying the control signals for the transistors of the two semiconductor switches 14, 16 (gate terminals).

The connection point for the center terminal U is located in the third busbar 24. The electrical "wiring" of the electronic switching element 12 illustrated is such that a connection of the first busbar 20 by way of microvias 40, 42 to the first semiconductor switch 14 and to the first leadframe 34 is established. The first semiconductor switch 14 is connected to the third busbar 24, by means of which a connection to the electric motor EM (not illustrated here) by means of the center terminal U is established again.

The first semiconductor switch is actuated by means of a control signal terminal 25, which is embedded in an electrically isolated manner in the busbar (in this case the third busbar 24) arranged above the first semiconductor switch 14. The center terminal U of the third busbar 24 is then connected by way of microvias to the second leadframe 36, situated below said microvias, and to the second semiconductor switch 16 arranged on the second leadframe 36. The second semiconductor switch 16 is again connected by way of a plurality of microvias 50 to the second busbar 22 situated above said microvias. A control signal terminal 25 of the second semiconductor switch 16 is embedded in an electrically isolated manner in the busbar (here: the second busbar 22) situated above said second semiconductor switch.

As already described, the link capacitors are arranged in the top plane of the second busbar 22 between the first busbar 20 and the second busbar 22. A partial busbar 20c, which is connected by way of microvias 44 to the first busbar 20, is provided for this purpose.

The already described plated-through holes 20a, 20b, 22a, 22b are provided for the purpose of the terminal of a high-capacitance link capacitor (not illustrated). (Alternatively, the SMD embodiment (SMD: surface-mount device) already discussed above is also possible.)

Figure 5:
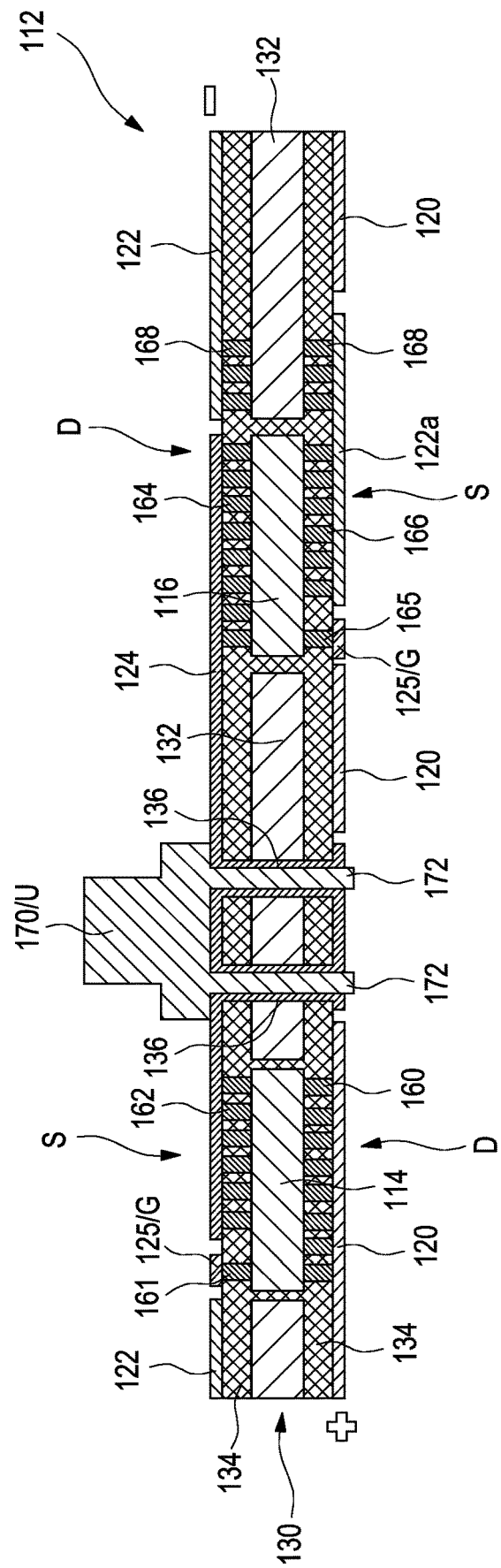
FIG. 5 shows a schematic sectional illustration of a further embodiment of an electronic switching element according to the invention.

FIG. 5 shows a further exemplary embodiment of an electronic switching element 112 according to the invention having a so-called alternating arrangement of the semiconductor switches 114, 116.

The electronic switching element 112 is formed as a conductor structure element 130, which is formed of a layer sequence, namely a core or carrier layer 132, which may be configured as a conductive layer to which an isolating layer 134 adjoins on both sides. Conductor tracks for forming a first busbar 120, a second busbar 122 and a third busbar 124 are in turn provided on the two isolating layers 134. In addition to a conductive core layer 132 (that is to say a layer made completely of copper, for example), the use of a copper-clad structured internal layer or a completely non-conductive internal layer are alternatively possible.

A first semiconductor switch 114 and a second semiconductor switch 116 are arranged in the described layer construction in recesses provided therefor in the carrier layer 132. The first semiconductor switch 114 is connected by way of microvias 160 to the first busbar 120 and using microvias 162 to the third busbar 124. The second semiconductor switch 116 is accordingly connected by means of microvias 164 to the third busbar 124 situated above said microvias and by means of microvias 166 to a partial section 122a, situated below said microvias, of the second busbar 122 running in the top plane itself. The partial section 122a of the second busbar 122 is electrically connected by means of plated-through holes (blind holes) 168 on the (electrically conductive) core layer 132 to the actual second busbar 122. In the case of a copper-clad or non-conductive core layer, these would be continuous plated-through holes 168.

A center terminal U is provided in the third busbar 124, said center terminal being able to be configured as a press-in contact 170, which engages through the conductor structure element 130 using contact pins 172. In order to produce the greatest possible contact-connection surface between the third busbar 124 and the press-in contact 170, a plated copper coating extends through the passage holes 136, which are provided for receiving the contact pins 172, of the conductor structure element 130 as far as the plane at the bottom of the illustration of FIG. 5 (the plane of the first busbar 120). Note: in the illustration of the plan view of FIG. 6, the representation of the head of the press-in contact 170 has been omitted for reasons of better clarity.

Finally, control signal terminals 125 for the first and the second semiconductor switching element 114, 116 are also provided, in each case one terminal on the top plane and the bottom plane, which control signal terminals are connected by means of vias 161 and 165, respectively, to the two semiconductor switches 114, 116.

The arrangement illustrated is a so-called alternating arrangement, that is to say the two semiconductor switches 114, 116 are arranged tilted or pivoted by 180° with respect to one another. In the exemplary embodiment illustrated, this means that the first semiconductor switch 114 is connected with its drain terminal D pointing downward to the first busbar 120 (positive pole), while the source terminal S and the gate terminal G point upward. In contrast, the second semiconductor switch 116 is tilted by 180° such that the drain terminal D thereof points upward (and is connected there to the third busbar 124, which is connected at its other end to the source terminal S of the first semiconductor switch 114). The source terminal S and the gate terminal G of the second semiconductor switch 116 accordingly point downward to the plane of the first busbar 120. The described and illustrated alternating arrangement makes a particularly compact construction of an electronic switching element according to the invention possible.

In accordance with the invention, the first busbar 120 and the second busbar 122 extend in parallel and in large parts overlapping one another in two different planes of the electronic switching element, wherein they also largely overlap the two semiconductor switches.

In the exemplary embodiment of FIGS. 5 to 7, the first semiconductor switch 114 is overlapped both by the first busbar 120 and the third busbar 124, whereas the second semiconductor switch 116 is overlapped by the third busbar 124 and the second busbar 122 (or rather the partial section 122a thereof in the plane of the first busbar 120). In order to ensure the depicted and illustrated arrangement, recesses 121b and 123, respectively, are provided in the first busbar 120 and the second busbar 122, into which recesses other busbar elements are inserted in an electrically isolated manner, namely the partial section 122a of the second busbar 122 is inserted into the recess 121b of the first busbar 120 and the third busbar 124 is inserted into the recess 123 of the second busbar 122.

As can be readily seen from the illustration of FIGS. 6 and 7, the first and the second busbar 120, 122 extend over the entire width of the conductor structure element 130. Furthermore, said busbars also extend over the entire length of said conductor structure element. As a result—and through the consequent contact-connection of all the used elements and terminals by way of microvias and plated-through holes—the effect of the inductance reduction is maximized.

The first busbar 120 furthermore has another further recess 121a, into which the contact pins 172 of the press-in contact 170 extend, together with a copper layer conductively connected to the third busbar 124. In the case of a surface-mounted contact 170a being used for the center tap U, the holes for the contact pins 172 and the further recess 121a could be omitted. A variant of this kind is illustrated in FIG. 8.

FIG. 8 shows an alternative configuration of a switching element 112a according to the invention that is similar to the illustration in FIG. 5, but with a surface-mounted contact 170a for the center terminal U.

As can be seen from FIG. 8, this means that no passage holes through the layer construction 130a are necessary and no recess 121a in the first (bottom) busbar 120a is required, since the third busbar 124a does not extend to the bottom side. The configuration of FIG. 8 otherwise corresponds to that of FIG. 5.

Further layers can adjoin the layer structures illustrated in FIGS. 2 to 7, for example in order to contact-connect the control terminals 25, 125 and to complete the electronic switching elements. In particular, the layer construction illustrated can be integrated as such into a printed circuit board, as is illustrated using the example of the embodiment illustrated in FIG. 9.

Figure 9:
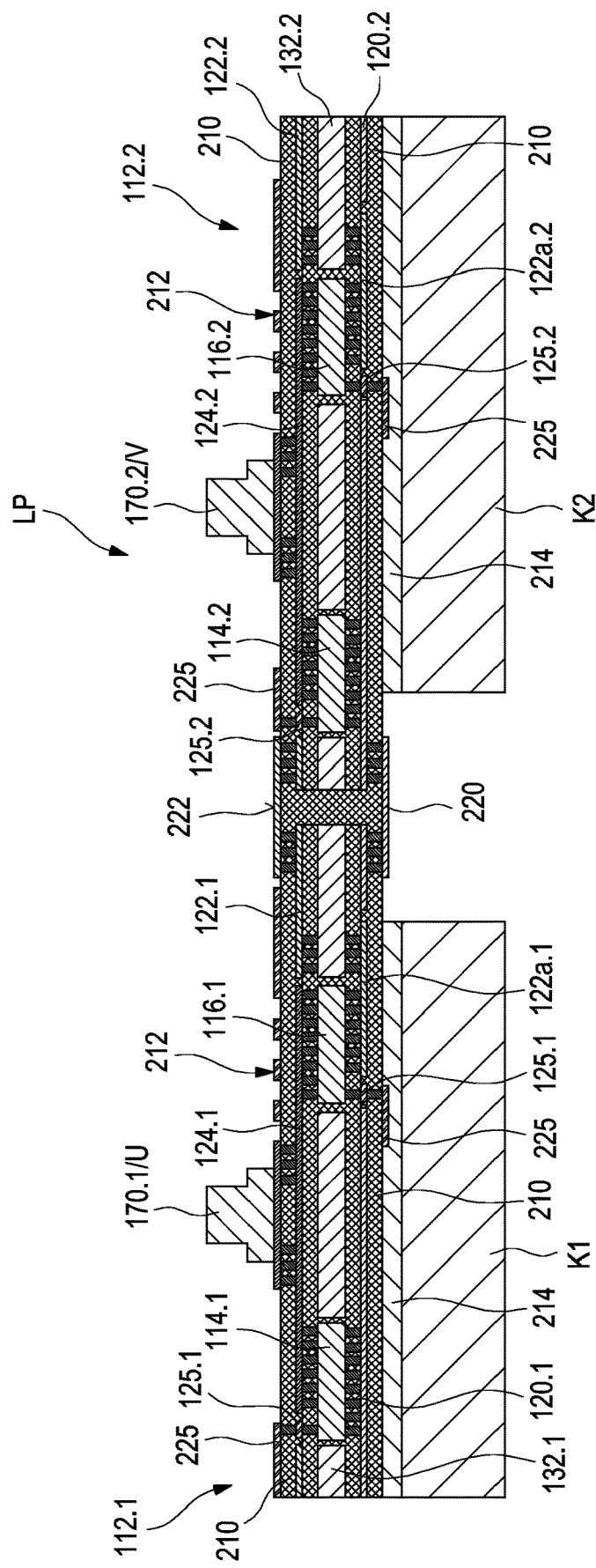
FIG. 9 shows a printed circuit board construction having two electronic switching elements according to the invention of FIG. 8.

FIG. 9 shows, by way of example, embedding of two switching elements 112.1 and 112.2 according to the invention, which are configured as half-bridges, into a printed circuit board LP, said switching elements substantially corresponding in terms of their construction to the construction illustrated in FIG. 8. The reference numerals of corresponding features and elements have been increased by "100". For the description of the electronic switching elements 112.1 and 112.2 themselves, reference is made to the above description of FIGS. 5 to 8.

The two switching elements 112.1, 112.2 configured as conductor structure elements can—as illustrated—be embedded in a core layer or else another plane of a printed circuit board. In each case, an isolating layer or layer sequence 210 made of prepreg and/or prepreg plus internal-layer material (such as FR4) with which the switching elements 112.1, 112.2 are pressed adjoins above and below.

As an alternative to prepreg, glass-fiber-free dielectric materials with sufficient thermal conductivity can also be used.

The switching elements 112.1, 112.2 are arranged slightly spaced apart from one another behind one another in the longitudinal direction. In the transition region between the two switching elements 112.1, 112.2, conductor sections 220, 222 are formed on the isolating layers, said conductor sections each being connected by means of vertical contact-connections, such as microvias, for example, to the two first busbars 120.1, 120.2 and to the two second busbars 122.1, 122.2, respectively, in order to thus ensure an electrical connection between the two switching elements 112.1, 112.2 to form the parallel connection thereof.

Even further conductor tracks for interconnecting or adding logic circuits can be provided on the surface of the isolating layer 210, as is denoted schematically by the reference numeral 212.

In the exemplary embodiment illustrated, contacts 170.1 and 170.2 for the center terminals U and V, respectively, are mounted on a copper layer of the outer isolating layer 210 and connected by means of vertical contact-connections such as microvias, for example, to the third busbar 124.1 or 124.2 of the two switching elements 112.1, 112.2 respectively situated below said microvias. Alternatively, it is possible—in a corresponding configuration—to use a contact already present on the switching elements (cf. FIGS. 5 and 8).

Finally, conductor tracks 225 are also provided on the isolating layer for connecting the control signal terminals 125.1, 125.2 of the two switching elements 112.1, 112.2.

Layers 214 made of a thermally conductive material (TIM: thermal interface material) are mounted on an opposite side (in the side of the printed circuit board LP that points downward in the illustration), said layers in turn being in contact with one or more heatsinks K1, K2. The heatsink can be formed integrally with a recess in the region of the transition connection 220 between the two switching elements 112.1, 112.2 or in two parts (or possibly also in several parts) with respectively one part K1, K2 below an associated switching element 112.1, 112.2. In addition, the at least one heatsink has recesses, which are not shown in detail, for the underlying control signal terminals 225 and the contact-connection thereof.

The thermally conductive layer(s) 214 can be made of conductive or non-conductive material depending on the application; a person skilled in the art selects the exact properties of the thermally conductive layer(s) 214 from the interaction with the material used as isolating outer layer 210.

In an alternative embodiment (not illustrated), the heatsinks can instead be arranged on only one side of the printed circuit board LP, for example in alternating fashion on both sides; accordingly, either the contacts 170 would also have to be arranged in alternating fashion or recesses would have to be provided in the heatsinks for the contacts 170. In the exemplary embodiment of FIG. 9, the heatsink denoted by the reference numeral K2 could be arranged, for example, on the top side of the second switching element 112.2.

The illustration of link capacitors has been omitted in FIGS. 5 to 9 for reasons of clarity.

Figure 10:
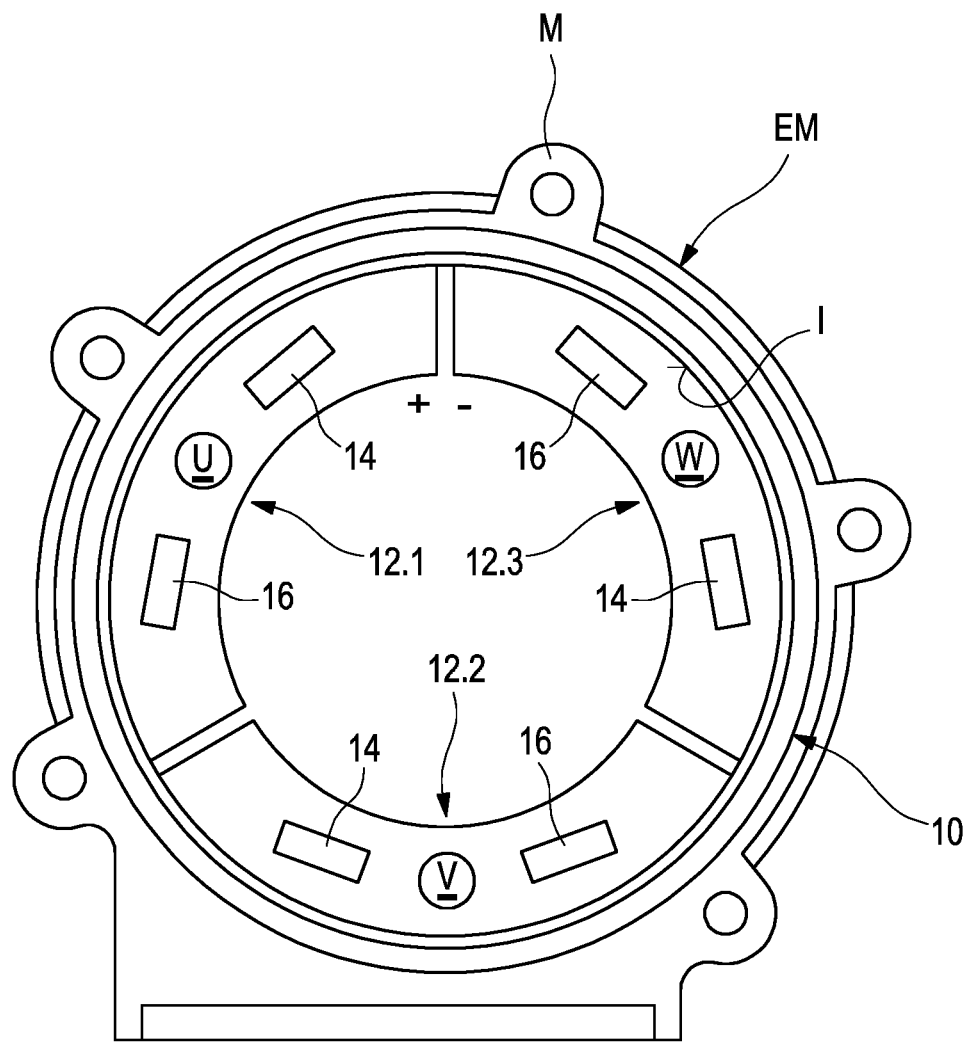
FIG. 10 shows a highly schematic view of a motor housing for an electric motor having three ring-segment-shaped electronic switching elements according to the invention.

FIG. 10 shows a highly schematic view of a motor housing M of an electric motor EM in a lateral plan view of an end side of the motor housing M.

The motor housing M consists, for example, of a diecast block, which has an internal surface I having a substantially circular internal cross section.

A converter 10 is inserted into the motor housing M in accordance with the invention, said converter likewise having a circular outline, which substantially corresponds in terms of the outer dimensions thereof to those of the internal cross section of the motor housing M, with the result that exact placement of the converter 10 in the motor housing M is possible.

The converter 10 is formed of three electronic switching elements 12.1, 12.2, 12.3 according to the invention, of which one of each has a ring-segment shape (in the example illustrated a 120° ring-segment shape), which makes it possible to form a circular ring from the three switching elements in the assembled and wired state. This can be done as described with reference to FIG. 9, for example by integrating the three switching elements 12.1, 12.2, 12.3 into a corresponding printed circuit board having a likewise corresponding circular cross section.

It is readily apparent for the person skilled in the art that, although in the present case a 120° ring segment is discussed, the electronic switching element in practice actually has an angular extent of somewhat less than 120°, in order to make it possible to assemble the three switching element modules without problem to form a complete ring in each case each having a spacing between modules. The three switching elements (embedded in a printed circuit board) then together produce a full circle of 360°. The same applies for other angle specifications discussed in the context of this application.

The highly schematic illustration of FIG. 10 likewise shows the respective first and second semiconductor switches 14, 16 of each of the three switching elements 12.1, 12.2, 12.3 and the respective center terminals U, V, W thereof, which are connected to phase current lines (not illustrated) of the electric motor. The positive and negative poles or terminals are likewise illustrated.

At least one protrusion (not illustrated) can be provided on the internal surface I of the motor housing M, said protrusion being dimensioned in such a way that the converter according to the invention (therefore the printed circuit board in which the three switching elements are embedded) can be placed on the protrusion for mounting in the motor housing and can be fixed there. Given suitable dimensions and arrangement, said protrusion can then serve as a heatsink for the placed printed circuit board for diverting the power loss generated by the semiconductor components and possibly the busbars. The protrusion can be formed of one part or several parts (as a plurality of protrusions). The protrusion or protrusions can be formed integrally with the diecast block of the motor housing. In this way, no separate heatsinks are required and the diecast block of the motor housing that is present anyway can be used for cooling.

Alternatively, the described protrusions for supporting/applying and cooling the converter printed circuit board can also be mounted in a cover of the motor housing. Furthermore, in a still further configuration, the protrusions can be provided in distributed fashion on the interior of the motor housing and on the lid of the motor housing, as a result of which support and cooling of the printed circuit board is produced from both sides of the printed circuit board, for example in the context of an alternating arrangement, as mentioned above.

As a further exemplary embodiment according to the invention, FIG. 11 shows a schematic cross-sectional illustration of an electronic switching element configured as a switch DS.

The switch DS comprises a semiconductor switch 314, which is inserted in a conductor structure element 330 with a core layer 332 and adjoining (above and below) isolating layers 334. As already described above, the semiconductor switch 314 is inserted into a recess provided therefor in the core layer 332 and is pressed there with the isolating layers 334.

Provided as outer layers of the switching element 312 according to the invention are a current-carrying busbar 320 (in the exemplary embodiment at the bottom) connected by means of microvias 360 to a drain contact D of the semiconductor switch 314 and a further busbar 324 connected by means of microvias 362 to a source contact S of the semiconductor switch 314.

In the exemplary embodiment illustrated, a contact 370 is mounted on the further busbar 324, by means of which contact a connection to a load V can be established, which in turn can be connected to ground or to the negative pole of the power source. As has already been stated in the above description, the contact for conducting away the current from the further busbar 324 can be mounted only after the switch DS has been embedded in a printed circuit board.

FIG. 12 shows an illustration analogous to FIG. 11 of an example for a redundant switch arrangement of a switch DSR according to the invention. Identical elements have identical reference numerals, with the addition of "R" where appropriate.

The redundant electronic switching element 312R of the switch DSR has an elongated conductor structure 330R for receiving a further semiconductor switch 316, said elongated conductor structure comprising, in particular, a core layer 332R having a further recess for receiving the further semiconductor switch 316.

To form a parallel circuit between the semiconductor switches 314, 316 to be used redundantly, the two busbars are accordingly elongated over the length of the conductor structure element 330R. The two semiconductor switches 314, 316 are arranged in the same orientation for this purpose, that is to say the two drain contacts D point in the same direction (downward in the exemplary embodiment illustrated) and the two source contacts S point in the same direction. The current-carrying bottom busbar 320 is thus connected by way of microvias 360, 364 to the two drain contacts and the further (top) busbar 324 is thus connected by way of microvias 362, 366 to the two source contacts S of the two semiconductor switches 314, 316. Control signal terminals 325 are accordingly provided for the two gate contacts G. Said gate contacts are arranged in recesses provided therefor in the further busbar 324 as already described above with reference to FIGS. 5 to 7.

The described and illustrated switching element has two semiconductor switches for illustration. A redundant circuit often has three or even more semiconductor switches. Redundant switches of this kind can be inserted into a printed circuit board, as described. On account of the extremely low physical height of the switching elements according to the invention, printed circuit boards can be equipped with a multiplicity of switches of this kind.

Of course, the semiconductor switches of a switch according to the invention, as has been described by way of example with reference to FIGS. 11 and 12, can also be mounted on a leadframe and, on said leadframe, can be inserted into the layer sequence of the conductor structure element.

In connection with the present invention, an electronic switching element is understood to be any type of at least one electronic switch, such as a MOSFET, IGBT, thyristor or the like, for example, having a partial circuit arrangement, in particular an integrated circuit. In the broadest sense, this can mean bridge switches, which are suitable for constructing multi-pulse bridge circuits. When using IGBTs, the use of so-called freewheeling diodes may be necessary, which is clear to the person skilled in the art from his expert knowledge.

Of course, the switching elements can also have more than two semiconductor switches for bridge circuits, as may be necessary in applications with relatively high currents and/or powers.

The invention claimed is:

1. An electronic switching element, comprising:
   at least one semiconductor switch inserted into a layer sequence of a conductor structure element;
   at least two busbars, which are configured to contact-connect the at least one semiconductor switch;
   the at least two busbars run substantially above one another in a planar manner substantially over an entire width and length of the conductor structure element in the layer sequence of the conductor structure element to minimize interference inductances;
   the at least two busbars are each configured as a conductive layer in the conductor structure element; and
   the at least two busbars have a planar shape.

2. The electronic switching element as claimed in claim 1, wherein the at least one semiconductor switch is arranged in a core layer of the conductor structure element and, from the at least two busbars for contact-connecting the at least one semiconductor switch, at least one busbar runs in a plane of the conductor structure element below the core layer and at least one busbar runs in a plane of the conductor structure element above the core layer.

3. The electronic switching element as claimed in claim 1, wherein the at least one semiconductor switch comprises two or more semiconductor switches connected in parallel.

4. The electronic switching element as claimed in claim 1, wherein the at least one semiconductor switch is mounted on a leadframe.

5. The electronic switching element as claimed in claim 1, wherein:
   the at least one semiconductor switch comprises a first semiconductor switch and a second semiconductor switch, which are inserted in the layer sequence of the conductor structure element;
   the at least two busbars comprises a first busbar and a second busbar for contact-connecting the first and the second semiconductor switch; and
   a third busbar connecting the first and the second semiconductor switch to one another.

6. The electronic switching element as claimed in claim 5, wherein the first busbar runs substantially in a plane of the conductor structure element below the first and the second semiconductor switch and the second busbar runs substantially in a plane of the conductor structure element above the first and the second semiconductor switch.

7. The electronic switching element as claimed in claim 6, wherein the third busbar runs in the plane of the first busbar or the plane of the second busbar.

8. The electronic switching element as claimed in claim 6, wherein the third busbar is arranged in a recess in the first or the second busbar.

9. The electronic switching element as claimed in claim 5, wherein the first semiconductor switch and the second semiconductor switch are each mounted on a first leadframe and a second leadframe, respectively.

10. The electronic switching element as claimed in claim 9, wherein the first and the second busbars are connected to the first and the second leadframes by means of plated-through holes or microvias.

11. The electronic switching element as claimed in claim 9, wherein the first busbar or the second busbar at least partly overlaps at least one of the first leadframe and the second leadframe.

12. The electronic switching element as claimed in claim 5, wherein the electronic switching element has at least one first link capacitor between the first busbar and the second busbar.

13. The electronic switching element as claimed in claim 5, wherein the electronic switching element is a half-bridge.

14. The electronic switching element as claimed in claim 5, wherein the electronic switching element has a circular or ring-segment-shaped outline.

15. The electronic switching element as claimed in claim 1, wherein the at least two busbars comprise a first busbar and a second busbar each arranged substantially above or below the at least one semiconductor switch.

16. The electronic switching element as claimed in claim 1, wherein the at least two busbars are connected to the at least one semiconductor switch by means of plated-through holes or microvias.

17. The electronic switching element as claimed in claim 1, wherein at least one of the at least two busbars at least partly overlaps at least one of the at least one semiconductor switch.

18. A printed circuit board comprising at least one electronic switching element as claimed in claim 1.

19. A printed circuit board comprising a plurality of the at least one semiconductor switch as claimed in claim 4.

20. A converter comprising at least two electronic switching elements as claimed in claim 5 connected in parallel.

21. The converter as claimed in claim 20, wherein the converter is configured as a printed circuit board.

22. A motor housing for an electric motor, wherein the motor housing has an internal space having an internal surface having a substantially circular internal cross section, in which a converter having a plurality of ring-segment-shaped electronic switching elements as claimed in claim 5, is arranged.

23. The motor housing as claimed in claim 22, wherein the converter is formed of three 120° -ring-segment-shaped or six 60° -ring-segment-shaped or n (360°/n)-ring-segment-shaped switching elements.

24. The motor housing as claimed in claim 22, wherein at least one protrusion for receiving the converter is configured on the internal surface of the motor housing.

25. The motor housing as claimed in claim 24, wherein the at least one protrusion is integrally formed with the motor housing and serves as a heatsink for the electronic switching elements of the converter.

26. The motor housing as claimed in claim 24, and further comprising a cover for covering the internal space of the motor housing, wherein at least one protrusion for receiving the converter is formed in the internal space or the cover.

27. The motor housing as claimed in claim 26, wherein the at least one protrusion comprises multiple protrusions formed in alternating fashion in the internal space and the cover.

28. The motor housing as claimed in claim 22, wherein the converter is configured as a printed circuit board including the at least one electronic switching element.

* * * * *